United States Patent [19]

Rigling

[11] Patent Number: 4,898,636
[45] Date of Patent: Feb. 6, 1990

[54] MULTILAYER PRINTED WIRING REGISTRATION METHOD AND APPARATUS

[76] Inventor: Walter S. Rigling, 113 Bridgeview Court, Longwood, Fla. 32779

[21] Appl. No.: 347,290

[22] Filed: May 4, 1989

[51] Int. Cl.$^4$ .......................... C23F 1/02; B44C 1/22; C03C 15/00; C03C 25/06
[52] U.S. Cl. ..................................... 156/626; 156/634; 156/645; 156/656; 156/666; 156/902; 156/345; 29/852; 427/97
[58] Field of Search ............... 156/626, 627, 629, 630, 156/634, 645, 656, 659.1, 661.1, 666, 901, 902, 345; 29/846, 852; 174/68.5; 427/97

[56] References Cited

U.S. PATENT DOCUMENTS

| | | | |
|---|---|---|---|
| 3,562,036 | 2/1971 | Travis | 156/626 |
| 3,649,475 | 3/1972 | Degnan et al. | 156/902 X |
| 4,631,100 | 12/1986 | Pellegrino | 156/902 X |

Primary Examiner—William A. Powell
Attorney, Agent, or Firm—Macdonald J. Wiggins

[57] ABSTRACT

A method of registering a plurality of substrate boards in a laminated printed wiring panel to permit drilling for plated-through holes at centers of terminal areas, which have shifted from design locations during processing of the boards and panel, involves drilling of a small target pilot hole at a known location through a substrate board prior to etching of a printed wiring pattern thereon. A small disc of magnetically detectable material is inserted into the pilot target hole and a printed wiring pattern is then etched on the board. After etching of the drilled board, it is laminated with other printed wiring substrate boards to form a composite printed wiring panel. A magnetic detector using a transparent container with a small magnetic disc floated on the surface of a thin layer of water in the container is placed on a top surface of the board and moved to permit the magnetic disc to center over the embedded disc. The center coordinates of the magnetic disc are measured and an offset factor indicative of the shifted terminal area centers is determined. This shift factor is applied to all design drilling coordinates for drilling of the through-holes.

7 Claims, 3 Drawing Sheets

PRIOR ART

MULTILAYER PRINTED WIRING REGISTRATION METHOD AND APPARATUS

BACKGROUND OF THE INVENTION

1. Field of the Invention

The present invention relates to multilayer printed wiring boards, and more particularly to a method and apparatus for accurately registering laminated printed wiring boards for drilling operations.

2. Description of the Prior Art

Multilayer laminated printed circuit wiring boards are commonly used in complex, high density electronic circuits. The individual layers of a laminated board may be composed of glass-fabric reinforced substrates for a rigid board, and of unreinforced film for a flexible board. Each substrate board may have a circuit wiring pattern of copper foil on one or both sides thereof. Each conductor terminates in a terminal area or pad. The wiring pattern is formed by etching of a sheet of copper foil bonded to the substrate board prior to lamination.

The outer faces of the outermost substrate layers have unetched copper foil bonded thereto either prior to or at the time of lamination. One or more insulating bonding sheets consisting of an adhesive matrix impregnated into a glass fabric substrate or an insulating bonding film having an adhesive medium on the surfaces thereof are disposed between each pair of inner substrate boards. The multiple layers of boards are laminated by applying heat and pressure to form a relatively thick composite panel. A typical panel thickness may be 0.062 inches. As will be recognized, a composite panel is thus produced having no distinguishable external features.

It is necessary to now interconnect terminal areas of the inner substrate boards with the outside surface printed wiring by first drilling through-holes which should pass through the centers of the generally circular terminal pads of the substrates. The drilling is most commonly accomplished by means of a numerically controlled (NC) drilling machine, digitally programmed with the coordinates of each point on the panel to be drilled as specified by the design data. After drilling through the terminal areas, the entire panel is electroplated, plating the outer unetched copper foil as well as producing a conductive cylinder through each through-hole. The cylinder bonds to the edges of any printed wiring pad in each layer that occurs at that through-hole location.

However, the processes of etching the substrate board surfaces to produce the wiring, and the heat and pressures of laminating, cause the internal terminal areas in the laminated panel to be shifted slightly from their design locations. Such shifting is due to several factors, including: release of stresses which were formed when the copper foil is bonded to the insulation layers, then relieved during etching away of the non-functional copper; release of stresses during a baking operation after etching and cleaning; and shifting of terminal areas during the final lamination process. The shifting from these causes is unpredictable and must be specifically determined for each panel.

As will now be understood, each terminal area will be shifted from its design center x,y location to an unknown center x',y' location. If holes were drilled at the x,y locations, a hole would not pass through the actual x',y' centers and the integrity of the panel would be compromised. Although the specific locations of the centers are not known, it has been found that use of individual substrate layers composed of the same materials and construction, and processed in the same manner will have the magnitude and directions of dislocation to be approximately equal. Thus, if the center location of a terminal area is known for one layer, the corresponding point on the other layers will be known within acceptable limits.

A common prior art method for solving this problem is to drill a pilot hole somewhat smaller than the through-hole design specification using a drill machine programmed to place the hole in a target terminal area at a center specified by the design data. The drilled panel is removed from the drill machine and X-rayed, by fluoroscopic or radiographic means, to determine the position of the pilot hole with respect to the true center of the shifted target area. The direction and magnitude of the target area displacement is accurately measured and a drill position offset factor entered into the drill controller. The functional holes may then be correctly drilled.

This method is expensive and time consuming since the panel must be drilled, removed from the drill bed, X-rayed, an offset determined by measurement on the radiograph, and then returned to the drill bed. Thus, there is a need for a method which permits determination of center location corrections without the necessity for X-rays or removal of the panel from the drill bed.

SUMMARY OF THE INVENTION

The method of the invention involves placing an interior substrate board on a numerically controlled drilling machine prior to etching of the wiring circuit and drilling a small target pilot hole at a preselected design location. The target may be either a functional target area or a known preselected nonfunctional area. The hole may be 0.005 to 0.02 inches smaller in diameter than a functional through-hole. The board may be divided into several zones, and a target hole drilled in each zone.

A disc of soft iron equal in diameter to the target pilot hole and not thicker than the substrate board is pressed into the target pilot hole. Thereafter, the substrate board is processed to produce the required printed wiring pattern. The board with the embedded soft iron disc is combined with the other panel substrate boards and bonding sheets, and laminated to produce the composite panel. As will be recognized, the composite panel will have continuous copper foil on both upper and lower external surfaces, therefore, visual locations of the target discs cannot be made. It is expected that the centers of the target discs will not be at the coordinates specified by the design but will have been displaced by some magnitude and direction from the design location. Thus, location of the center of the soft iron disc will permit determination of the shift of coordinates of its zone during the etching and laminating processes. The numerically controlled drill machine may then be programmed to offset and accurately drill all of the through-holes in each zone to an acceptable tolerance.

In accordance with the invention, the location of the disc can be accurately determined by use of a magnetic detector. The detector is moved over each target area at a design center location until centered over the iron disc. The coordinates of the center of the detector are measured and the offset distances x'-x and y'-y programmed in the drill machine for that zone.

A suitable magnetic detector in accordance with the invention is a small, transparent, sealed plastic container, partially filled with a liquid. A magnetic disc, approximately equal in diameter to the iron disc is floated on the liquid. When the container is placed on the panel near the design target center, the float magnet will align itself over the iron disc. The coordinates of the center of the float magnet are measured and the dislocation offset determined for programming of the drill machine. After drilling of all holes with the programmed offsets, the panel is ready for further processing.

Thus the invention eliminates the cost and time of X-raying of panels and provides a simple and accurate method of correcting for dislocation of terminal areas during fabrication of multilayer printed wiring panels.

It is therefore a principal object of the invention to provide a method and apparatus to determine the magnitude and direction of dislocation of points on interior substrate layers of printed wiring panels without the use of X-ray type methods.

It is another object of the invention to provide a means for embedding a detectable element in an inner substrate board of a multilayer printed wiring panel in a known location to permit determination of a shift of the known location during processing of the composite panel.

It is still another object of the invention to provide a soft iron disc that can be embedded in an inner substrate board of a multilayer composite printed wiring panel, and a magnetic detection device for accurately locating the postion of the iron disc.

It is yet another object of the invention to provide a method for determining the offset coordinates of points on inner substrate boards of a multilayer composite panel from design positions due to shifting of such points during processing of the panel.

It is another object of the invention to provide a simple, low cost magnetic detector having a floating magnet which will align with an embedded soft iron insert within a composite printed circuit board when the detector is placed near the position of the insert.

These and other objects and advantages will become apparent from the following detailed description when read in conjunction with the drawings.

DETAILED DESCRIPTION OF THE PREFERRED EMBODIMENT

Figure 1:
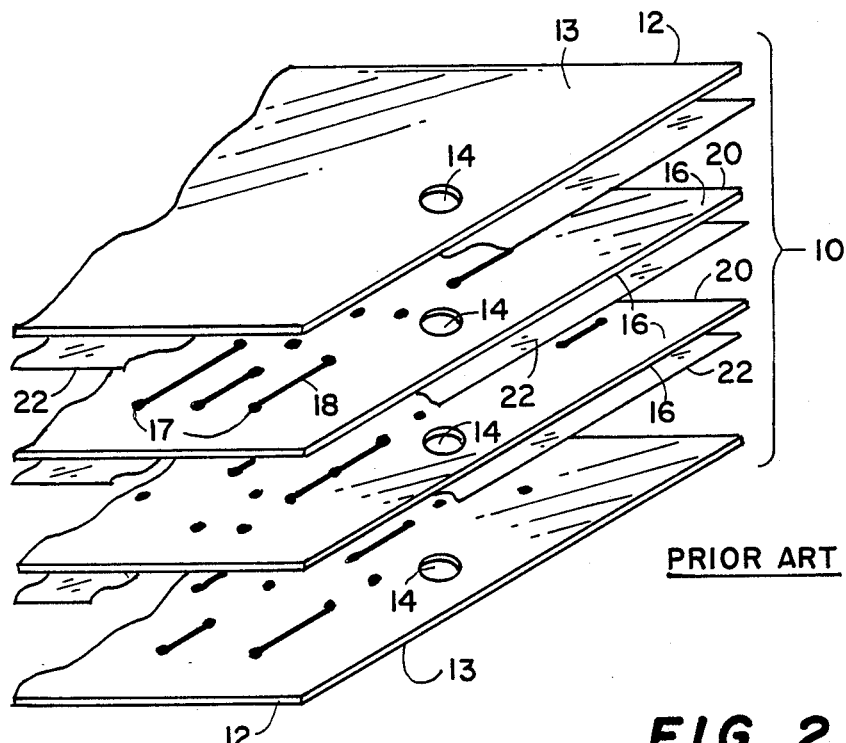
FIG. 1 is an exploded perspective view of a typical prior art composite multilayer printed wiring panel prior to drilling and further processing into a plated-through hole printed wiring board.
Figure 2:
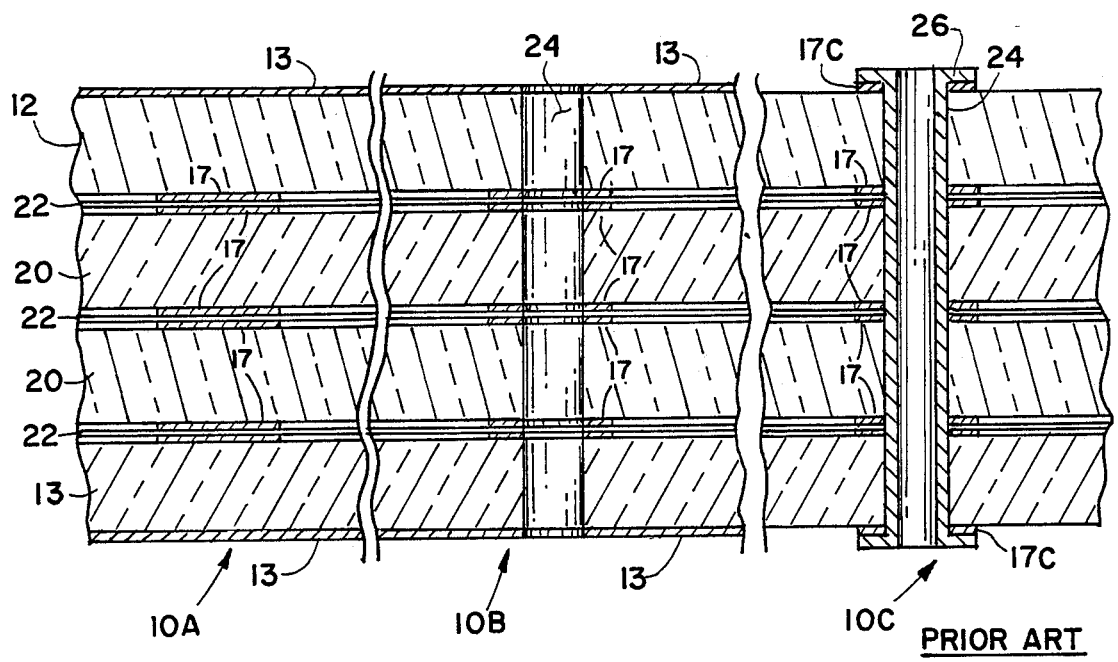
FIG. 2 is a cross-sectional view of portions of the prior art printed wiring panel of FIG. 1 showing the process of producing plated-through-holes.

The method and apparatus of the invention will be explained with reference to a multilayer printed wiring board, which may be of the rigid type, the flexible type, or a combination of each type. FIG. 1 shows a partial perspective view of a typical prior art rigid multilayer printed wiring panel 10 to which the invention is applicable. Panel 10 is shown in exploded view to reveal details of construction. Four substrate boards are shown, although the the invention is not limited to such number. The panel includes upper and lower boards 12, and two interior boards 20. At the stage of fabrication of panel 10 of FIG. 1, the outer surfaces of boards 12 have a sheet of copper foil 13 bonded thereto, while the interior surfaces 16 have been coated with copper foil, and etched to produce desired printed wiring patterns. Registration holes 14 are provided in boards 12 and 20 which are used during subsequent lamination and drilling operations as discussed hereinafter. The printed wiring generally includes a plurality of terminal areas or pads 17, which are preferably circular, interconnected by conductors 18. Printed wiring may be provided on one or both sides of boards 12 and 20. One or more sheets of adhesive-impregnated glass fabric 22 or a sheet of insulating film 22, which includes a bonding adhesive on each side thereof is provided between each pair of adjacent boards. As is known in the art, a composite panel 10 is formed by compressing the stack and applying heat and pressure to bond the boards together as shown in the cross sectional view of FIG. 2.

The prior art board 10 of FIG. 1 is shown with three stages of the prior art process indicated. Portion 10A illustrates board 10 after the laminating process. It is to be understood that the scale of the figure has been exaggerated to show details thereof, and that the spacing between etched circuitry on adjacent boards will vary depending on the number of sheets of bonding film chosen. Additionally, the thickness of terminal areas 17 is shown greater than actual, and adhesive film 22 will bond to the etched away portions of the surfaces as well as to the copper coated portions.

Portion 10B of board 10 is shown after drilling of hole 24 through a set of terminal areas 17. An ideal situation is shown for illustrative purposes that generally does not exist; i.e., the terminal areas of the four boards are perfectly registered and hole 24 is drilled in the center thereof. The next step of fabrication is illustrated by portion 10C of panel 10 in which the composite panel 10 is electroplated which forms cylinder 24 that bonds to the edges of interior terminal areas 17, thereby connecting the internal terminal areas to outer terminal areas 17C and has then been etched to produce a desired wiring pattern thereon.

Figure 3:
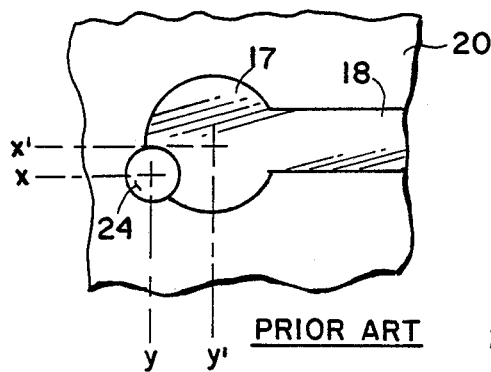
FIG. 3 is a view of a prior art terminal area of an internal substrate board of the panel of FIG. 1 showing a hole drilled at the design coordinates of the center thereof showing a typical dislocation of the center of the terminal area.

As discussed hereinabove, the laminating, bonding, etching, and cleaning processes of fabrication of panel 10 cause shifting of the actual centers of terminal areas 17 from the design locations. FIG. 3 shows a typical prior art terminal area 17 in which through-hole 24 has been drilled in accordance with the design center location at coordinates x,y. Due to shifting of terminal area 17 during fabrication, the actual center is at coordinates x',y'. Through-hole 24 therefore contacts only a portion of terminal area 17 and the electrical contact area of a plated cylinder would be reduced. In some instances, the through-hole may miss the terminal area.

Figure 4:
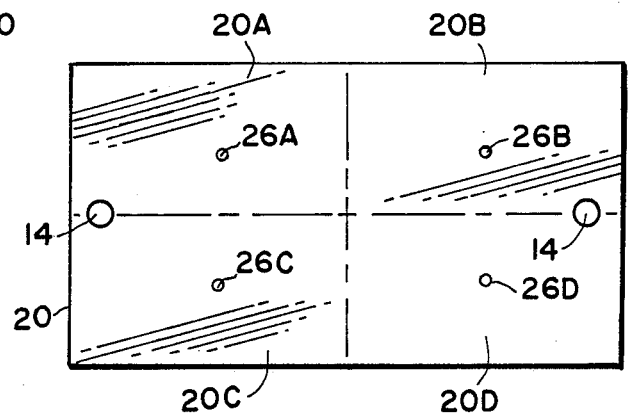
FIG. 4 is a perspective view of an internal substrate board having target pilot holes drilled therethrough in accordance with the method of the invention.

FIG. 4 illustrates a first step in the method of the invention. An interior substrate board 20 is shown divided into four zones, 20A, B, C, and D. Prior to etching of the printed wiring pattern on board 20, a target pilot hole 26 is drilled in each zone at a known location, such as the coordinates of a terminal area. However, other known points on the board may be used. The diameter of target pilot hole 26 is selected to be less than specified for through-holes 24. It is to be understood that the number of zones to be used is determined by the size and complexity of the board.

Figure 5:
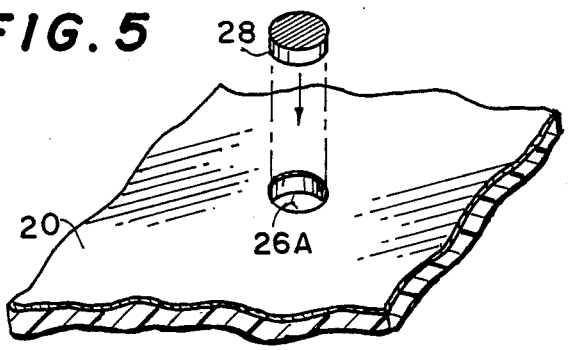
FIG. 5 is an enlarged view of a target pilot hole of FIG. 4 and a soft iron disc for insertion into the pilot hole.

After target pilot holes 26 have been drilled, the next step in accordance with the invention is the insertion therein of a soft iron disc 28 as shown in FIG. 5. This step may be accomplished manually, or by a numerically controlled "pick and Place" machine commonly used in the printed circuit assembly industry. Disc 28 has a diameter to provide a snug fit in target pilot hole 26A and a thickness equal to or less than the thickness of board 20. A disc 28 is inserted into each target pilot hole 26.

Figure 7:
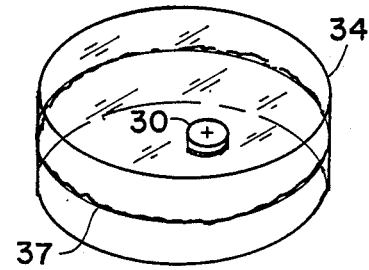
FIG. 7 is a perspective view of a magnetic detector using the float magnet of FIG. 6.
Figure 6:
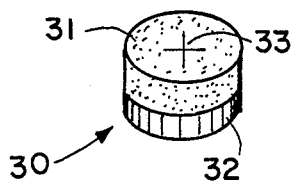
FIG. 6 is a perspective view of a magnetic float for detection of the iron disc of FIG. 5.

The next step is to etch the required wiring pattern and to complete the fabrication of the board 20 having iron discs 28 installed therein. The composite panel substrate boards are then assembled and laminated. Preferably, board 20 with target discs 28 is placed adjacent to an external board 12. As will now be recognized, a composite panel 10 has been fabricated having the target soft iron discs 28 embedded within design locations which will have shifted slightly during fabrication. It is thus desired to locate the true coordinates of each of the discs 28 to provide offset values for programming of the drilling machine. To locate each disc, a magnetic detector is used. A simple, low cost detector suitable for the purpose is shown in FIGS. 6 and 7. A floating circular magnet assembly 30 has a circular permanent magnet 32 with a diameter approximately equal to the diameter of a disc 28. A flotation element 31 is attached to an upper surface of magnet 32 and may include a center indicator 33, which may be a cross mark or other target. FIG. 7 shows a transparent, sealed plastic container 34 containing a thin layer of a liquid 33, such as water, glycerin, light oil, or the like. Magnet assembly 30 floats on liquid 33 and therefore moves easily over the surface thereof.

Figure 8:
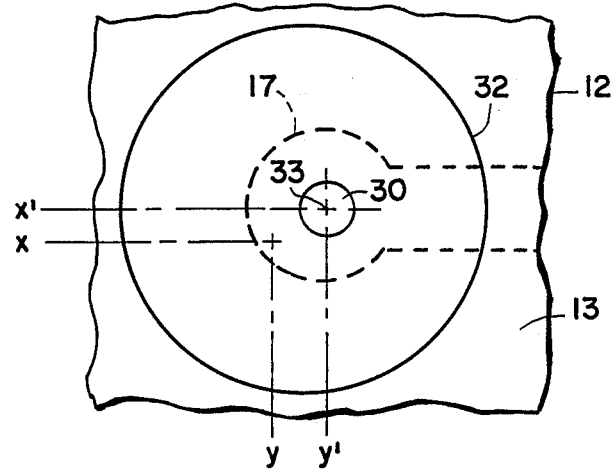
FIG. 8 is section of the board of FIG. 4 having an iron disc embedded in a pilot hole indicating location of an offset with the detector of FIG. 6.

To locate a center with the magnetic indicator, container 34 is placed on the upper board 12 in the region of the internal location of a target disc 28. FIG. 8 is view of container 34 on board 12 over a disc 28. Magnetic assembly 30 has aligned itself with disc 28 in terminal area 17 of an internal board 20. Center indicator 33 is thus directly over coordinates x',y', the shifted location of terminal area 17. Since original coordinates x,y are known, the offset can be determined.

Figure 9:
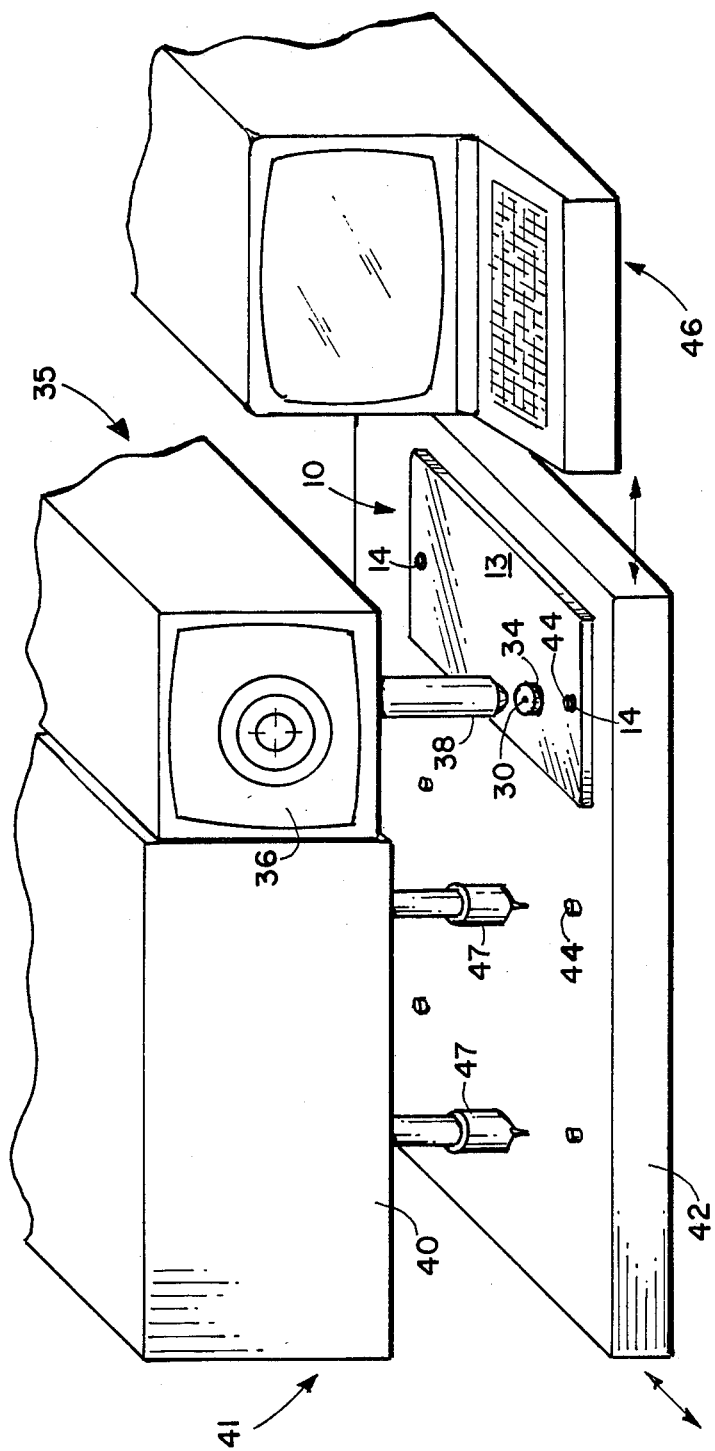
FIG. 9 is a perspective view of a drilling machine and optical microscope for determining the offset of a target pilot hole location in accordance with the invention and for drilling through-holes.

Various optical techniques for determining coordinates x',y' are known by those skilled in the art. A preferred apparatus and method is illustrated in FIG. 9. A numerically controlled drilling machine 41 includes drill bed 42 which is movable in the x,y directions as indicated by the arrows. An optical microscope 35 is fixed over bed 42 and includes viewing screen 36 that displays features under microscope element 38. Video monitor 46 is coupled to bed 42 and programmed to display the x,y coordinates of any feature on bed 42 and under the center of microscope element 38 as well as each drill spindle 47. Such assemblies are commonly integrated with NC drill machines for the purpose of direct on-drill programming or as discrete system for verification of printed wiring masters and tooling artwork features.

A composite panel 10 having target iron discs 28 embedded therein is shown mounted on bed 42 with registration holes 14 engaging pins 44. Panel 10 is within the field of optical microscope 35. Detector container 34 has been placed on panel 10 and table 42 moved to the design coordinates of a target disc 28 as displayed on monitor 46. Magnetic assembly 30 will center over the embedded disc 28 and bed 42 is adjusted to bring the center indicator 33 under the cross hairs of microscope element 38. The new coordinates x',y' are read from the monitor 46 and the offset factor is then programmed into the numerical control computer for that zone of panel 10. The panel 10 on bed 42 is moved under a drill head 47 and the through-holes drilled at the offset centers. The process is repeated for each zone. Panel 10 is then ready for plating and further processing.

The apparatus for locating the shifted centers in a laminated, multilayer printed wiring panel has been described for exemplary purposes. Other types of magnetic detectors may be used with the method, and the method can utilize other types of detectable materials for embedding within the panel. For example, radioactive materials can be externally detected. Such variations in apparatus and method are considered to fall within the spirit and scope of the invention.

I claim:

1. A method of registering terminal areas of the substrates of a laminated printed wiring panel, wherein the centers of the terminal areas have shifted from known design locations, for drilling holes therethrough prior to plating of electrical interconnections through the holes comprising the steps of:
    (a) drilling, at a point of known design coordinates, a target pilot hole through an interior substrate board of the panel, prior to etching of a printed wiring pattern thereon and prior to lamination of the substrate board in the panel, said pilot hole having a diameter smaller than a terminal area;
    (b) inserting a disc of detectable material into the drilled target hole;
    (c) etching a printed wiring pattern on the drilled substrate board;
    (d) fabricating the laminated multilayer panel with the drilled substrate board and undrilled substrate boards;
    (e) detecting the location on the panel of a center of the detectable disc; and
    (f) measuring the shift of the center of the pilot hole from the known design coordinates thereof, which shift occurs during etching and fabrication.

2. A method of fabricating a laminated printed wiring panel formed by laminating a plurality of printed wiring boards, each board having a plurality of terminal areas at coordinates of known design locations in which the locations shift during fabrication of printed wiring patterns on the boards and during lamination of the panel, comprising the steps of:

(a) drilling at least one target pilot hole smaller than a terminal area through one of the interior substrate boards prior to etching of a printed wiring pattern thereon and prior to the fabrication of the panel, the pilot hole being drilled at a point of known coordinates;

(b) inserting a disc of magnetically detectable material into the drilled target pilot hole;

(c) etching a printed wiring pattern on the drilled substrate board;

(d) assembling the drilled and etched substrate board with undrilled interior substrate boards etched with wiring patterns, and with a pair of exterior boards having unetched outer surfaces to thereby form a multilayer printed wiring panel;

(e) laminating the assembled substrate boards;

(f) placing a magnetic detector onto a top surface of the laminated panel, the detector having a magnetized disc floating on a thin layer of liquid, and moving the detector over the top surface to permit the magnetized disc to align with the inserted disc;

(g) measuring the coordinates of the center of the magnetized disc with respect to the known coordinates thereof to define offset coordinates;

(h) correcting the known design coordinates of each terminal area by the offset coordinates; and (i) drilling through-holes through the panel at the offset-corrected design coordinates for each terminal area to thereby provide through-holes for plating.

3. The method as defined in claim 2 in which step (g) includes the steps of:

(j) placing the panel on a bed of a numerically controlled drilling machine having an optical microscope programmed to display coordinates of the center of the optical microscope field of view;

(k) moving the bed to place the center of the magnetized disc on the optical microscope field of view center; and (l) entering the displayed coordinates into the numerically controlled drilling machine for calculation of an offset factor.

4. The method as defined in claim 3 in which step (i) includes the steps of:

(m) programming the numerically controlled drilling machine to apply the offset factor to correct each set of terminal area design coordinates; and (n) drilling the through-holes at each set of corrected coordinates.

5. The method as defined in claim 2 which includes the further steps of:

(o) dividing the substrate board into at least two zones;

(p) repeating steps (a) and (b) for each zone; and (q) repeating steps (f) through (i) for each zone.

6. An apparatus for locating an unknown point on an inner substrate of a laminated panel comprising:

a small magnetically detectable disc embedded in said inner substrate prior to lamination of said panel, said disc having a center at said unknown point;

a container;

a thin layer of liquid in said container; and a magnetized disc essentially the size of said magnetically detectable disc floated on said liquid;

whereby said container is placed on a top surface of said panel and moved until said magnetized disc centers itself over said magnetically detectable disc.

7. The apparatus as defined in claim 6 in which said container is closed and includes a transparent top surface.

* * * * *